United States Patent [19]
Gay et al.

[11] Patent Number: 4,461,922
[45] Date of Patent: Jul. 24, 1984

[54] SOLAR CELL MODULE

[75] Inventors: Charles F. Gay; V. K. Kapur, both of Northridge; James H. Wilson, Altadena, all of Calif.

[73] Assignee: Atlantic Richfield Company, Los Angeles, Calif.

[21] Appl. No.: 466,233

[22] Filed: Feb. 14, 1983

[51] Int. Cl.³ .............................................. H01L 31/04
[52] U.S. Cl. .................................... 136/249; 136/251; 357/30
[58] Field of Search .......................... 136/249 TJ, 251; 357/30

[56] References Cited

U.S. PATENT DOCUMENTS

| | | | |
|---|---|---|---|
| 2,949,498 | 8/1960 | Jackson | 136/249 TJ |
| 3,376,163 | 4/1968 | Abrahamsohn | 136/260 |
| 4,094,704 | 6/1978 | Milnes | 136/244 |
| 4,295,002 | 10/1981 | Chappell et al. | 136/244 |
| 4,338,480 | 7/1982 | Antypas et al. | 136/249 TJ |
| 4,400,577 | 8/1983 | Spear | 136/259 |

FOREIGN PATENT DOCUMENTS 1129220  1/1957  France ............................. 136/249

Primary Examiner—Aaron Weisstuch
Attorney, Agent, or Firm—Nilsson, Robbins, Dalgarn, Berliner, Carson & Wurst

[57] ABSTRACT

Individual panels of solar cells are stacked one on top of the other and arranged so that incident light passes through each of the arrays of cells in each panel striking the one below it. The solar cells in each panel are selected to have a predetermined and different spectral response and thus are responsive to different frequencies of light. Electrical connection is individually made to each of the panels to collect the electrical energy generated from conversion of the light incident on the particular array of cells. Each of the panels may independently be constructed from microcrystalline thin films, amorphous silicon, single crystal silicon, compound semi-conductors, and the like. Individual panels may be constructed of the same semi-conductor material but compositionally modified to provide sensitivity to different portions of the light spectrum.

24 Claims, 9 Drawing Figures

SOLAR CELL MODULE

BACKGROUND OF THE INVENTION

1. Field of the Invention

The invention relates to solar cells for converting light into electrical energy and more particularly to separate panels of solar cells stacked one upon the other to form a stacked solar cell module.

As used throughout this specification and the claims the following terms have the following meanings:

Solar cell or cell, an individual discrete member having a junction therein and capable of directly converting photons to electrical energy;

Thin film solar cell, a solar cell fabricated from microcrystalline, amorphous, compound, or semiconductor material other than single crystal semiconductor material deposited in situ upon a substrate;

Panel, an array or group of solar cells interconnected to provide an output of electrical energy;

Module, one or more panels confined within an appropriate housing and capable of being placed in long term service for production of electrical energy.

Array, depending upon the context, a group of solar cells forming a panel or a group of modules positioned to receive photons for direct conversion to electrical energy.

Spectral response, sensitivity to a predetermined portion of the light spectrum less than the whole thereof.

2. The Prior Art

It has long been desirable to capture as much of the sun's spectrum as possible to convert it directly into electrical energy through the utilization of solar cells. Conventional single-crystal solar cells appear to be rapidly approaching the ultimate intrinsic limits of their conversion efficiency. As a result, other types of solar cells are being considered and constructed, such as those made from gallium arsenide and other similar materials. While such materials may have a higher efficiency of conversion than single-crystal silicon, there is a limit to the ultimate efficiency which can be expected.

To increase the collection efficiency, consideration has been given to cascading solar cells, as is discussed in the article "Material and Device Considerations for Cascade Solar Cells" by Salahm Bedair, Sunil B. Phatak and John R. Hauser which was published in the April 1980 issue of *IEEE Transactions on Electron Devices,* Volume ED-27, No. 4, pp. 822-831. As is therein disclosed, one of the approaches to improve efficiency makes use of two or more cells to more efficiently utilize the solar spectrum. A first approach utilizing such plurality of cells is that of spectrum splitting. That is, the solar spectrum is split into two or more parts by the use of filters and as a result a narrower band of photon energies is incident on each individual cell. As a result, each cell must respond to a narrower range of photon energies and each of the cells can then be optimized at a higher efficiency than can one single cell for the entire solar spectrum. One experimental apparatus used a silicon single-crystal cell for the low energy photons and an aluminum gallium arsenide (AlGaAs) cell for the high energy photons.

Another approach is to connect two individual solar cells in optical and electrical series. In this approach the wide bandgap cell is located above the narrow bandgap cell. The high energy photons are then absorbed in the wide bandgap top cell while the low energy photons (those below the bandgap of the top cell) pass to the bottom cell for absorption. The cascaded cells were formed by utilizing a monolithic structure using a heavily doped tunneling interface to interconnect the cascaded cells. Such was accomplished by using an aluminum gallium arsenide/gallium arsenide cell structure with a heavily doped, very thin tunneling interface layer having a large bandgap (as large or larger than that of the top cell).

It will readily be recognized that the spectrum splitting concept requires mirrors, filters and two distinct solar cells. In addition, two distinct packages housing those solar cells and the spectrum splitting device are required. Those skilled in the art will readily recognize that the utilization of such a concept for commercial applications is not cost effective as compared to the state of the art solar cells.

The cascading of solar cells by optical and electrical series connection through the utilization of the thin highly doped tunneling interface requires matching of short circuit currents in order to achieve proper operation. This matching of short circuit currents becomes impossible when the cell is exposed to ambient sunlight simply because the frequencies of the ambient light on earth change throughout the day as the sun moves across the sky. Thus it will be recognized by those skilled in the art that short circuit current matching cannot be accomplished except for one frequency of the spectrum. Furthermore, if single-crystal structures are to be used for the cascaded cells as disclosed in the prior art, the interface connections require lattice matching to obtain the appropriate tunneling through the interface. Such has proven to be ineffective.

In each instance in the prior art, individual solar cells have been dealt with as opposed to interconnected arrays of such cells forming a complete panel of solar cells.

SUMMARY OF THE INVENTION

A plurality of panels of solar cells are stacked one upon the other with an optically clear, electrically insulative interface there-between. The solar cells in each of the panels have a different spectral response.

DETAILED DESCRIPTION

Figure 1:
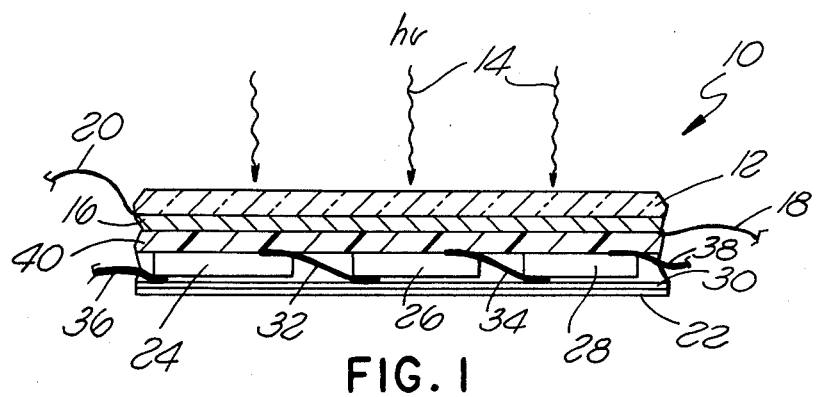
FIG. 1 is a schematic representation of a stacked solar cell module constructed in accordance with the present invention.

The stacked solar cell module of the present invention is shown generally at 10 in FIG. 1 in schematic representation. The stacked module is particularly significant in that a plurality of independent, solar cell panels each of which could be made separately operable are fabricated utilizing the desired materials responsive to predetermined different portions of the solar spectrum. By fabricating the panels separately, the particular techniques which are most proficient in the fabrication of the particular material may be utilized. After the completed fabrication of the solar cell panels, they are physically stacked one upon the other in a single module with an appropriate transparent interface therebetween which functions to allow photons to pass there-through. In this manner, by tailoring the spectral response of the solar cell panels, they can be made responsive to different portions of the solar spectrum and effectively tailored to achieve maximum efficiency of collection with respect to those predetermined areas. As will be recognized, any number of such panels may be stacked one on top of the other in like manner in a single module and each panel may be constructed using any desired semiconductor material.

In addition to the foregoing, this fabrication technique permits utilization of portions of the structure as the housing material for the completed stacked module. These fabrication techniques result in a higher efficiency solar cell array which may be tailored to fit a desired application, providing higher collection efficiency than heretofore possible, and at the same time with only a modest increase in the cost of manufacturing.

As is shown in FIG. 1, the stacked module 10 includes a transparent substrate 12 which may be constructed of various materials such as glass or plastics, through which the photons of light illustrated at 14 pass. A solar cell panel 16 constructed of thin film semiconductor material is deposited upon one surface of substrate 12 and is structured to provide an appropriate series of interconnected solar cells. The thin film may be, for example, a PIN microcrystalline thin film silicon/hydrogen solar cell layer having a first spectral response. Electrical connections or leads 18 and 20 are provided to collect the electrical energy generated through conversion of the photons 14 into electrical energy by the solar cell panel 16.

A second substrate 22 which may be metal, plastic or the like, which can withstand exposure to the elements and may form part of the ultimate housing, has positioned thereon typical single-crystal solar cells 24, 26 and 28 which may be separated from the substrate 22 by an appropriate layer 30 of insulating material or the like. Each of the solar cells 24 through 28 may typically be constructed of single-crystal material in wafer form which has a PN junction formed therein for use as a solar cell as is well-known in the art and having a second and different spectral response. The cells 24, 26 and 28 are inter-connected by appropriate electically conductive leads 32 and 34 to provide the usual series connected solar cells. Appropriate electrical leads 36, 38 then are connected to the series connection of solar cells and extend externally of the panel containing the cells 24, 26 and 28.

It will now be recognized by those skilled in the art that there is provided in a single module two separate discrete solar cell panels each operative in its own right to convert photons into electrical energy through the photovoltaic principle as is well known in the art. These two panels are stacked one upon the other with an appropriate interfacing layer 40 of optically transparent and electrically insulative material which can be a solid, liquid, or gas. The completed stacked module 10 may then be housed in appropriate frames or the like and used in the field to convert the solar spectrum to electrical energy.

It should also be recognized that in some instances the top solar cell panel may be fabricated using discrete cells with spaces therebetween. Obviously in such a case all of the light passing through the spaces will strike the panel or panels situated below the top panel.

Figure 2:
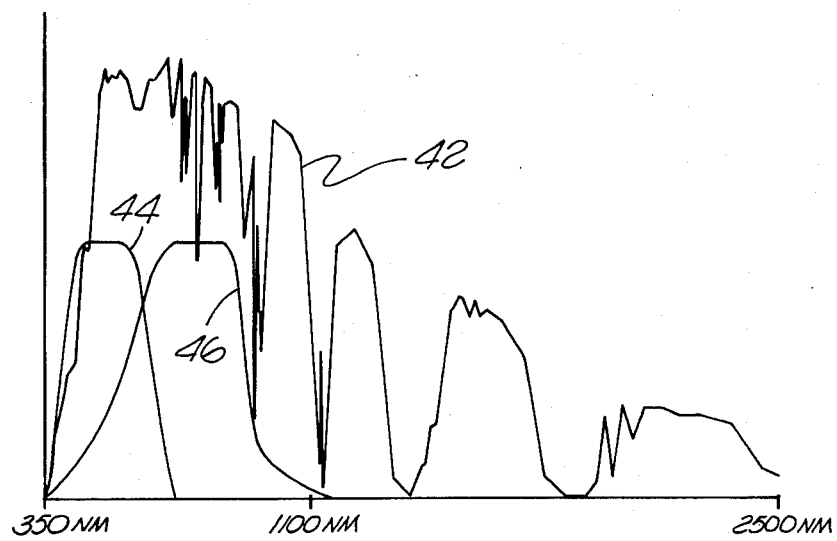
FIG. 2 is a graph illustrating recovery of the sun's spectrum by the device as illustrated in FIG. 1.
Figure 3:
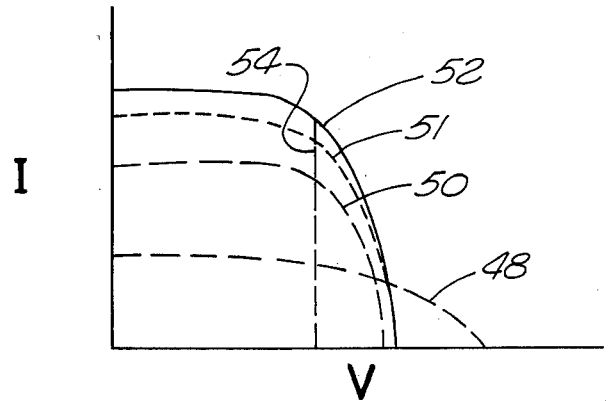
FIG. 3 is a current/voltage curve illustrating some results utilizing a structure as illustrated in FIG. 1.

FIG. 2 is a graph generally illustrating the response curves of the two stacked panels with respect to the solar spectrum. As is illustrated, the solar spectrum 42 extends from a frequency of approximately 350 nanometers to well beyond 2,500 nanometers. The monolithic thin film 16 may be fabricated to have a spectral response as shown at 44 while the single-crystal solar cell module may be constructed to have a spectral response as shown at 46. By tailoring the panels to have such spectral responses, a more efficient conversion of the solar spectrum is realized. This response is further represented in FIG. 3, which is a typical voltage/current curve of a solar cell. By appropriately matching the responses and voltages of the two panels one may obtain a matching of the maximum power points of the two panels. This is further illustrated in FIG. 3. The curve 48 illustrates the current-voltage curve of the thin film layer 16 while the curve 50 represents the current-voltage curve of the single-crystal cell panel while the curve 52 represents the composite of the curves 48 and 50. As can be seen by reference to the line 54, the maximum power points of the three curves are matched, thus providing substantially increased output from the stacked module as compared to either of the panels alone or from a typical single crystal panel without the thin film layer as shown at 51. Further as has been above pointed out, at the same time the entire stacked solar cell module constructed in accordance with the present invention is contained in a single package and can be substituted for the typical single-crystal solar cell panels currently being utilized in the field to form arrays positioned upon typical solar tracking devices and the like.

The stacked solar cell module structure constructed in accordance with the present invention allows a greater processing tolerance insofar as the fabrication of the single-crystal cells which form the single-crystal solar cell module. In accordance with current state of the art techniques, the depth of the PN junction in the typical single-crystal cell is relatively shallow so as to be more responsive to the shorter wavelength photons in the solar spectrum. In accordance with the structure of the present invention, the shorter wavelength solar energy is captured and converted by the monolithic layer 16 which is transparent to the longer wavelength solar energy. Thus the longer wavesolar energy passes through the monolithic layer and the interface and strikes the standard single-crystal solar cells situated on the bottom of that module. As a result, since these solar cells need only be concerned with the longer wavelength light, deeper PN junctions can be utilized, which means greater simplicity and ease in manufacture, fewer grid lines thereon to collect the electrical energy generated and further ease in making contacts to the face of the solar cell. Thus the cost of manufacture of the single crystal component parts forming the stacked solar cell module constructed in accordance with the present invention is less than those components as previously constructed in accordance with the prior art technique.

Although a specific example of microcrystalline thin film silicon/hydrogen (SiH) was given for the thin film layer, it will be understood by those skilled in the art that other types of material may also be utilized in addition to or in place thereof such as amorphous silicon hydrogen (a-SiH), amorphous silicon/nitrogen/hydrogen (a-SiNH) or amorphous/silicon/carbon/hydrogen (a-SiCH) or an organic solar cell such as that taught in U.S. Pat. No. 4,127,738 or the like.

Furthermore, although the above description has been given with respect to single-crystal solar cells, other types of solar cells may be utilized in addition to or in place thereof. Some of the other types which may be used may be constructed from materials such as cadmium telluride (CdTe), gallium arsenide, (GaAs) amorphous silicon-germanium-hydrogen (a-SiGeH), copper indium selenide, ($CuInSe_2$) or amorphous silicon tin hydrogen (a-SiSnH).

In each instance irrespective of the material used, it may be tailored by appropriate compositional adjustment of the material to be responsive to predetermined wavelengths of light and thus absorb and convert predetermined portions of the solar spectrum. Furthermore, the number of layers may be greater than two and each may be tailored to be responsive to a different section of the solar spectrum. In all instances, the modules would be stacked with the appropriate interface material which is optically transparent, electrically insulative and thermally stable. Examples of materials which are effective to form the interface layer are air, inert gas such as argon, silicone, polyvinyl butyral (PVB), and ethylene vinyl acetate (EVA).

In constructing the monolithic solar cell panel by depositing the layer 16 on the substrate 12, a layer of transparent conductive material (TC) is deposited on the substrate 12 and subsequently on the layer 16 after it is deposited on the substrate 12 so that such a TC layer is found on both sides of the monolithic layer 16. The TC layer may be formed of any transparent conducting material known to the art and usable with respect to semi-conductors and having the appropriate optical, electrical and mechanical properties to be compatible with the semi-conductor material being utilized. For example, gold (Au), indium-tin-oxide (ITO), tin oxide (TO), or indium oxide (IO) or other similar materials well known to the art may be utilized. By choosing and tailoring the properties of the TC layers, the voltages and optics of the system may be tailored in accordance with the particular semiconductor materials, compensational adjustments and cell doping being utilized. Another factor in using the particular TC layer is to choose a material which has a coefficient of thermal expansion and contraction which is compatible with the monolithic thin film. This will keep the film from being stressed during heating through absorption of the solar light. Also by choosing the appropriate index of refraction, extinction coefficient, thickness, conductivity and semi-conductor property of the TC layer, one may select the effective filter characteristics of the TC layer; that is, to refract all or part of the solar spectrum or to permit it to pass through the TC layer. Typically in accordance with the principles of the present invention, the TC layer will be selected with properties such that the light falling on it will be allowed to pass uniformly into the layer below.

Figure 4:
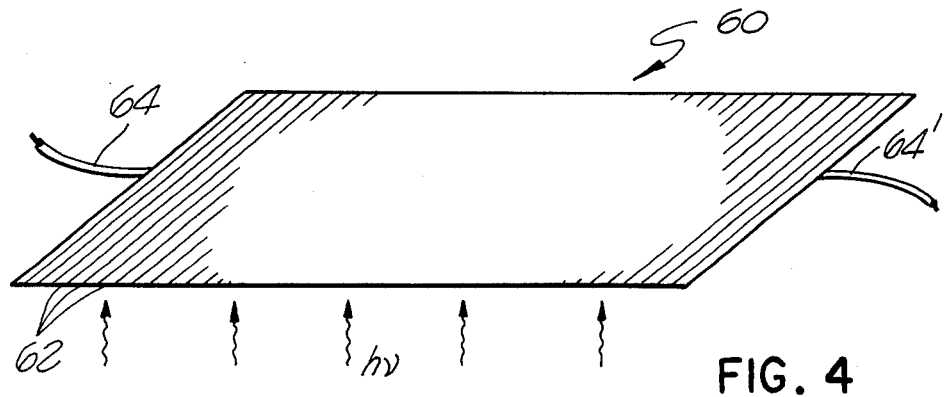
FIG. 4 is a perspective view of a monolithic solar panel used in the stacked module constructed in accordance with the present invention.
Figure 5:
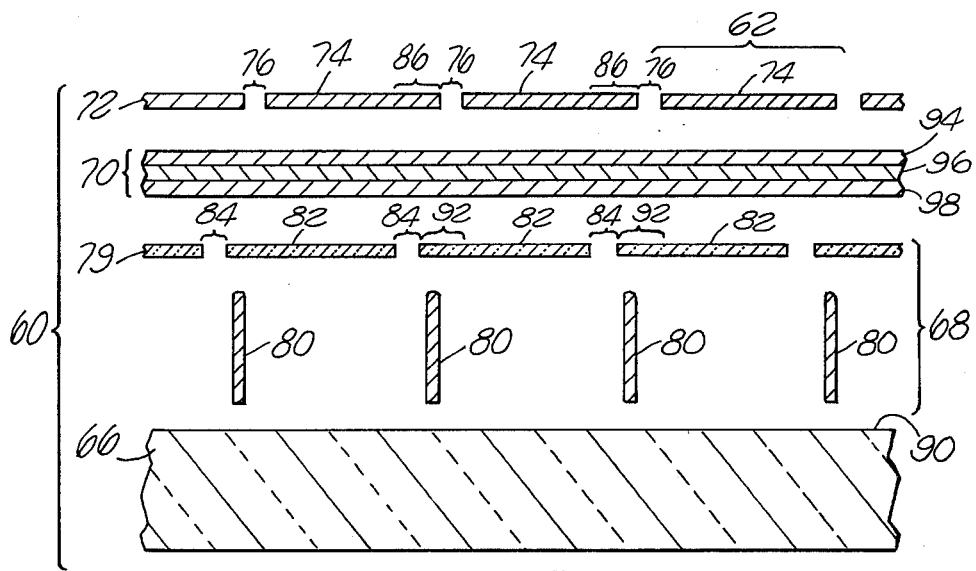
FIG. 5 is an exploded sectional view in schematic form of the structure illustrated in FIG. 4 and taken along the lines 5—5 thereof.
Figure 6:
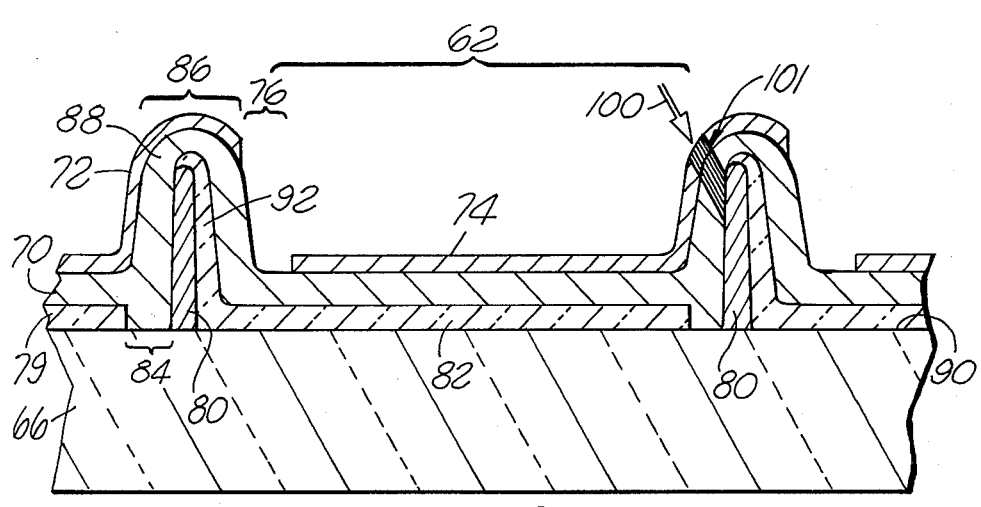
FIG. 6 is an enlarged sectional view illustrating a portion of the structure of FIG. 5 but in its finally constructed form.

The thin film solar cell panel used in accordance with the present invention may be constructed of various monolithic materials containing solar cells interconnected in various ways and deposited by various processing techniques. One preferred embodiment is illustrated in FIGS. 4–6, to which reference is hereby made. It should however be expressly understood that the following description and illustration is given by way of example only and not limitation.

FIG. 4 shows a monolithic thin film solar panel 60 constructed according to a preferred embodiment of the present invention. The panel defines a plurality of elongated solar cells 62 connected electrically in series between a pair of external leads 64–64'. The cells are shaped as narrow strips connected along opposite longitudinal edges to minimize series resistance losses. Connection between cells is accomplished directly through an unpatterned active film of the solar panel, without interrupting the film. Current generated by the cells in response to incident light (hv) travels a very short distance within each cell electrode before passing to the opposite electrode of an adjacent cell.

As seen in FIG. 5, the solar panel 60 comprises a transparent substrate 66 such as that shown at 12 in FIG. 1, a transparent front electrode 68, a continuous thin film 70 of photovoltaic material and a patterned back electrode 72. The electrode 72 comprises a plurality of back electrode portions 74 formed of a transparent conductive layer separated by a nonconducting spacing 76 and arranged to substantially overlie elongated photovoltaic regions of the thin film. The front electrode 68 includes a transparent conductive layer 79 and a series of thickened contact portions or "stitch bars" 80. The layer 79 is patterned to form a plurality of transparent electrode portions 82 separated by a spacing 84 and substantially underlying the respective photovoltaic regions. The photovoltaic regions are thus effectively sandwiched between the back electrode portions 74 and the front electrode portions 82 for collection of current generated within the regions. In addition, each front electrode portion partially overlaps the back electrode portion of an adjacent photovoltaic region over a preselected area 86.

A major feature of this construction is the provision of conductive paths substantially transversely through the active thin film 70 between each front electrode portion and the back electrode portion of an adjacent photovoltaic region. Interconnection is accomplished at the area of electrode overlap to connect the photovoltaic regions electrically in series without patterning or otherwise interrupting the film.

In the embodiment as illustrated, the stitch bars 80 are tall enough and narrow enough, in comparison to the thin film 70, to electrically short through the film. The final configuration of the solar module 60 is illustrated best in FIG. 6, wherein the stitch bars cause the subsequently applied film 70 to be distorted in a manner producing relatively thin regions 88 which are unable to withstand the cell voltage. Electrical conduction takes place through the regions 88. It is advantageous that the stitch bars be as rough as possible at their upper surfaces to focus the applied electric field and further reduce the resistance of the regions 88.

The stitch bars 80 are preferably approximately 25 microns thick, and the thin film 70 and the patterned transparent conductive layers 72 and 79 are approximately 2,000 and 1,000 angstroms thick, respectively. At the locations of the stitch bars 80, the film 70 is sandwiched between a pair of conductive elements and the stitch bars 80 are at least two times thicker than the thickest portion of the film 70. This produces an effective short circuit through the film in the area of each stitch bar, but does not short out the cells 62 because the film 70 has a very high sheet resistance. The sheet resistance virtually eliminates current within the plane of the film, leaving only substantially transverse currents developed within the photovoltaic regions and passed between the electrodes at the areas of overlap.

Referring to FIGS. 5 and 6 in more detail, the various layers and electrode portions of the panel 60 are sequentially deposited on a major surface 90 of the substrate 66. The substrate is preferably glass or other suitable transparent material which is compatible with the materials of the stitch bars 80 and the transparent conductive layer 79. The stitch bars may be applied to the substrate either before or after the transparent conductive layer, preferably by screen printing, electroplating or evaporation through a mask by techniques well known to the art. The material of the stitch bars may be silver, aluminum or other material providing a high quality contact.

Although the stitch bars 80 are illustrated as grid lines or sections of grid lines passing through the preselected areas 86 of electrode overlap, it is not necessary that they be continuous or that they be lines at all. If the stitch bars are screen printed, they should be at least approximately 25 microns in height to operate satisfactorily. If evaporated, they should be at least 2 microns, and preferably 10 microns, in height. In each case, the aspect ratio (height divided by width) and the roughness of the stitch bars are the parameters responsible for the localized short circuit that permits the panel 60 to operate. If the width of the bars is substantial in relation to their height, or the bars are smooth rather than rough, it may be necessary to increase their height beyond the values set out above. The voltage and current characteristic of the cells may be tailored by spacing of the stitch bars.

The transparent conductive layer 79 is preferably a transparent conductive oxide (TCO), such as indium tin oxide (ITO), tin oxide (TO) or indium oxide (IO). If ITO or IO are used, they typically will be applied after the stitch bars 80, as illustrated in FIGS. 5 and 6, whereas a layer of TO would be applied directly upon the glass substrate (not shown).

The transparent conductive layer 79 is preferably deposited, in the first instance, as a continuous layer. ITO, for example, may be deposited at approximately 300 degrees Celsius by vacuum evaporation of indium and tin in an oxygen atmosphere with glow discharge assistance. The glow discharge activates the oxygen to produce a high quality film. After deposition, the transparent conductive layer 79 is patterned using conventional techniques, such as laser scribing. In the case of the panel 60, the patterning operation entails removal of the transparent conductive layer along a series of parallel lines near the stitch bars 80, yielding the front electrode portions 82 separated by spacings 84. The front electrode portions are thus shaped as parallel strips corresponding generally in area to the cells 62 of FIG. 4. However, the front electrode portions 82 and the cells 62 need not be shaped as strips, as long as each front electrode portion is provided with an interconnecting portion 92 which overlaps part of the back electrode portion of an adjacent photovoltaic region. Although the layer 79 can be applied either before or after the stitch bars 80, it is preferably not patterned until after the stitch bars have been applied. The stitch bars 80 then act as a guide for patterning the layer 79.

The thickness of the transparent conductive layer 79 is selected to minimize reflection from the back surface of the layer and absorption of light by it. According to established optical principles, internal reflection losses within a transparent body are minimized when the thickness of the body is an odd multiple of the wavelength of incident light. For present purposes, the relevant wavelength is that at the peak of the spectral response of the photovoltaic material making up the film 70 as well as any solar cell layers therebelow. As above described, the panel may be constructed of several layers of semiconductor material and each layer may be selectively doped to respond to a different band of spectral energy. Therefore, the TCO layer would be optically tailored to pass that band of energy. The TCO layer will also be chosen to be thermally compatible with the layer 70.

As above noted, the thin film 70 may contain any suitable photovoltaic material defining a photojunction for conversion of light to electrical energy. In the preferred embodiment, the film 70 is microcrystalline thin film (MTF) silicon having $N^+$, I and $P^+$ layers 94, 96 and 98, respectively, as illustrated in FIG. 5. In the case of MTF silicon, the film 70 is deposited by conventional glow discharge techniques without patterning or masking. The film 70 extends continuously and completely across the stitch bars 80, the transparent conductive layer 79 and the spacings 84. The thickness of the film 70, complete with all three layers of different conductivity types, is approximately 2,000 angstroms. Although this dimension depends upon the material of the film 70, the stitch bars 80 must, in any case, be tall and rough, as compared to the thickness of the thin film. Otherwise, the desired conductive paths through the film will not exist.

The back electrode 72 serves as the back contact of the cells 62 and it is preferably a TCO layer formed by following the same parameters as above described.

Although shorting through the film 70 can be achieved in many circumstances with the structure described above, it is sometimes desirable to enhance localized conduction through the thin film 70 by applying heat to the solar panel 60. In the case in which the stitch bars 80 are relatively high, narrow and rough, such heat can cause diffusion of the back electrode material, and possibly the material of the stitch bars 80, into the semiconductive film 70. The resulting diffused region is much more conductive than the bulk of the film and enhances interconnection of the cells. The conductive materials may diffuse into the film as discrete atoms or exist as particulates occupying interstitial sites within the film. In the latter case, the conductive regions of the film comprise mixtures of metallic and semiconductive particles.

When heat is applied to the cell 60 to promote electrical conduction, it is usually desirable to apply the heat only at localized areas within the preselected areas of overlap 86. Thus, the bulk of the thin film 70 is unaffected by the heat and does not experience diffusion of the back electrode material, while the desired level of diffusion is obtained at the area of overlap. This approach is illustrated at the right hand side of FIG. 6, wherein a laser beam 100 is directed onto the back electrode portion 74 to produce a conductive region 101 at the relatively thin region 88.

Figure 7:
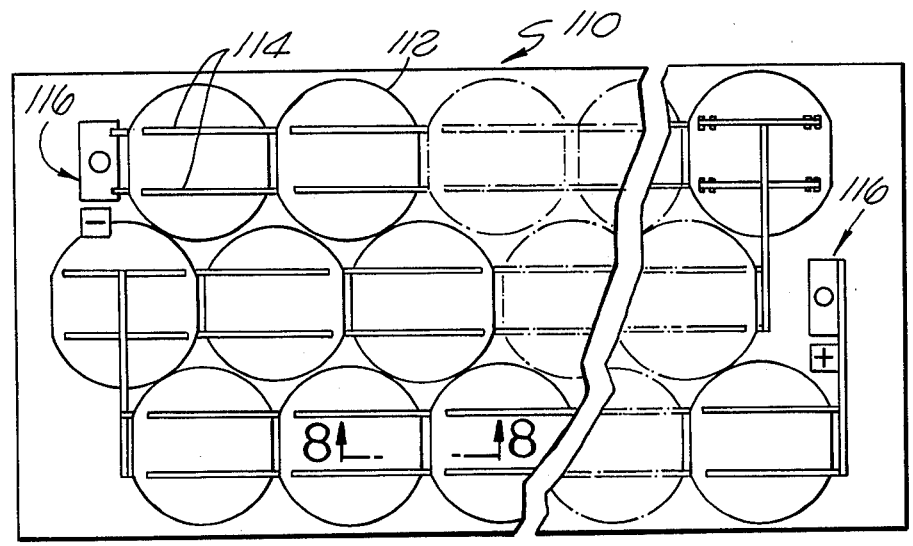
FIG. 7 is a bottom plan view partially broken away of a solar panel utilizing single-crystal solar cells which may be used for another array in the stacked solar cell module constructed in accordance with the present invention.
Figure 8:
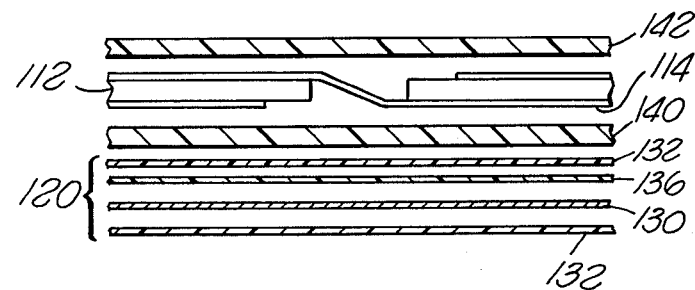
FIG. 8 is a fragmentary vertical sectional view taken along the lines 8—8 of FIG. 7.

As above noted, the lower panel of solar cells forming the stacked module of the present invention may be fabricated of various materials. A preferred embodiment uses single crystal silicon solar cells assembled into a panel as shown in FIGS. 7 and 8, to which reference is hereby made.

There is illustrated a solar panel 110 which includes an array of solar cells 112 positioned generally upon a back layer 120 and serially interconnected by the electrically conductive leads 114. A plurality of terminal arrangements 116 are provided for establishing external electrical connection to the solar cells 112. The back layer 120 comprises a metallic foil layer 130 laminated between a pair of electrically insulating and weatherable layers 132.

A layer 136 of high dielectric strength material may be provided within the back layer 120 between the foil layer 130 and the inner weatherable layer 132. The layer 136 thus enhances the electrical isolation of the foil layer 130 from the remainder of the solar panel 110, improving the high voltage chartacteristics of the panel. The layer 136 is particularly useful for increasing the dielectric standoff between portions of the solar cells 112 and the foil layer 130. The solar cells are commonly connected by a plurality of conductive ribbons 114 which can have burrs or other irregularities at cut ends thereof, approximating point sources of voltage relative to the foil layer. Without a layer of high dielectric strength such as the layer 132, a breakdown or excess current leakage might occur between the ribbons and the layer 130.

The layer 136 may comprise a layer of polyester or other suitable high dielectric material, preferably polyethylene terephthalate (PET). This material is available commercially as a high purity electronic grade film having a dielectric standoff of approximately 5,000 to 6,000 volts per mil and a resistivity of greater than $10^{16}$ ohm-centimeters. A PET film at least 3 mils thick has been found to be suitable for these purposes in panels rated at 250 volts.

The array of solar cells 112 is preferably encapsulated between a pair of transparent dielectric pottant layers 140 and 142. The pottant layers 140 and 142 are preferably approximately 15 mils thick, and may be made of any suitable transparent material, such as silicone, polyvinyl butyral (PVB) or ethylene vinyl acetate (EVA). PVB is a transparent thermoplastic pottant material which has been used in a number of prior solar panels. EVA is a thermosetting material which has also been used as an encapsulant. A particular formulation of EVA which has been found to be particularly attractive is the following: (1) 10 parts of Dupont's Elvax-150 ethylene vinyl acetate formulation; (2) 0.1 part of Ciba-Geigy's Tinuvin 770 and 0.3 part of American Cyanamid's Cyasorb UV-531 ultraviolet radiation absorbers; (3) 0.2 part of Uniroyal's Naugard anti-oxidant; and (4) 0.5 part of Penwalt's Lupersol 101 peroxide cross-linking agent. Also, the addition to the formulation of an organosilane primer, for example, 0.25 to 1.0 part of a mixture of 10% of Union Carbide's A1100 and 90% of Union Carbide's A174, or A174 alone, should improve the formulation's sticking characteristics during the panel formation process.

The insulating and weatherable layers 132 of the back layer 120 may comprise a suitable oriented film of polyvinyl fluoride resin, such as that manufactured by Dupont under the name Tedlar.

The layers 136 and 132 are preferably prelaminated to the foil layer 130 to form the back layer 120, permitting the back layer to be handled as a single element during the final manufacturing process.

Subsequent to the formation of the panel 60 as above described and the assembly of the various portions of the panel 110 as is illustrated in FIG. 8, the panel 60 is laminated together with the various portions comprising the panel 110 by application of appropriate heat and pressure. The TCO layer 72 of the panel 60 is brought into contact with the pottant layer 142 which functions as the interface between the two panels of solar cells. Thereafter, appropriate heat and pressure is applied to the combination of elements for a period of time sufficient to securely adhere the panels together and to allow the layers 140 and 142 to fill the void present in the solar cell structures 116.

Subsequently, the completed lamination is then placed within an appropriate frame which may be formed of any material desired, such as extruded aluminum. Once thus assembled, there is formed a stacked solar cell module which is fully sealed and self-sustaining for the direct conversion of solar energy to electrical energy at a much higher efficiency by utilization of various portions of the solar spectrum for which each of the panels have been tailored. The completed module is highly weatherable and reliable and thus is ideal for long term, maintenance-free use.

The processes above described and the specific embodiments illustrated and described result in a stacked solar cell module of the type shown in FIG. 1 with a thin film layer disposed over a single crystal layer. As above referred to, such illustration and discussion should not be taken as a limitation upon a scope of the present invention. Various other configurations of stacked solar cell panels containing solar cells therein may be fabricated and used without departing from the scope of the present invention. For example, a monolithic layer may be placed over a monolithic layer, a plurality of monolithic layers may be utilized as monolithic layers of the same spectral response and electrically interconnected with a tunneling junction may be utilized as the thin film solar cell panel or the like.

Figure 9:
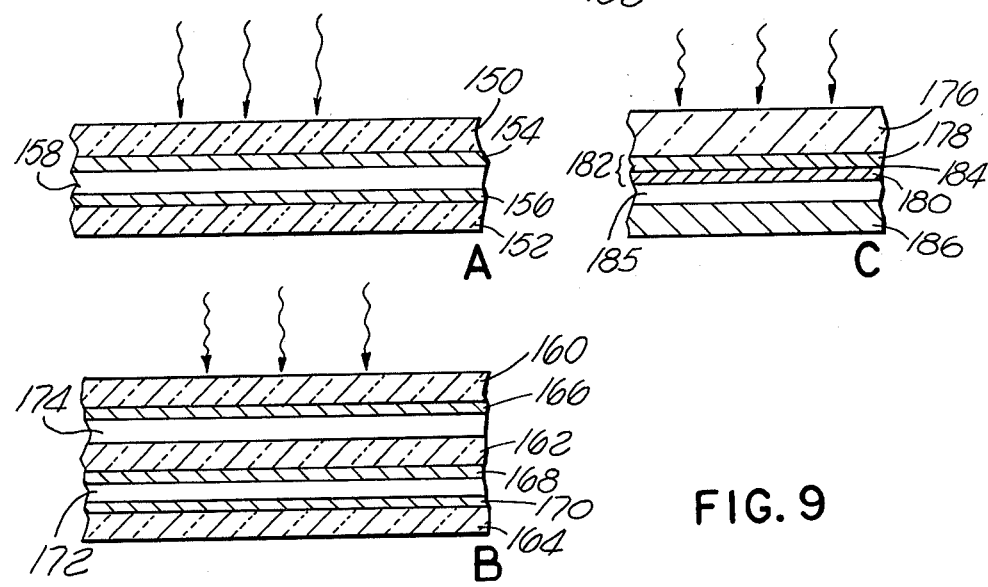
FIGS. 9A, B and C is a schematic representation of other embodiments of the present invention.

Some possible embodiments are shown in FIGS. 9A, B, and C, to which reference is hereby made. As is therein shown, a pair of glass substrates 150 and 152 may have formed on the surfaces thereof a thin film semiconductor panel as illustrated at 154 and 156. The two thin film semiconductor panels may then be brought together but separated by the optically transparent and electrically insulative layer 158 as above described. Again, the thin film solar cell panels 154 and 156 would be constructed of semiconductor material having different spectral responses.

Yet another embodiment is shown in FIG. 9B, which discloses glass substrates 160, 162 and 164. The glass substrate 160 has a thin film solar cell panel 166 formed thereon while the substrates 162 and 164 have thin film panels 168 and 170 respectively formed thereon. An optically transparent and electrically insulative layer 172 is used to bring the two panels 168 and 170 into face-to-face relationship much as is shown in FIG. 9A. An optically transparent layer 174 is used to adhere the substrate 160 with its thin film solar cell panel 166 thereon to the substrate 162. Obviously, since the substrate 162 is electrically insulative, greater freedom may be exercised in choosing the layer 174; however it will be recognized by those skilled in the art that the same layers as previously utilized, such as that at 172 may also be utilized in this embodiment.

As further shown in FIG. 9C, another embodiment includes a substrate 176 which may be formed of glass and which has deposited thereon tandem layers 178 and 180 of a monolithic semiconductor material to provide the overall thin film solar cell panel 182. The layers 178 and 180 may include active semiconductor material which has the same spectral response and is connected electrically together by a thin film tunneling layer 184 as described in the prior art. A layer of optically transparent and electrically insulative material 185 is then used to secure the substrate 176 with its thin film solar cell panel 182 thereon to an additional solar cell panel 186 which may have any configuration desired such as a single crystal solar cell panel as shown in FIG. 1 or any combination of thin film solar cell panels as above described.

In each event irrespective of the particular embodiment, it will be recognized that individual electrical leads are provided for each of the solar cell panels so that the electrical energy generated by each of the panels independently may then be interconnected to provide the necessary voltage and current for any desired application. This additional feature provides great flexibility in utilizing the stacked solar cell module constructed in accordance with the present invention in the field.

What is claimed is:

1. A photovoltaic module comprising:
   (A) a first independently operable panel of solar cells having a first bandgap and including a first optically transparent substrate having a plurality of thin film solar cells formed thereon, at least some of said thin film solar cells being electrically series interconnected;
   (B) a first transparent conductive layer between said first substrate and said thin film solar cells and a second transparent conductive layer on the other side of said thin film solar cells;
   (C) a second independently operable panel of solar cells having a second bandgap, said first and second band gaps being different, said second panel including a second substrate carrying a plurality of solar cells, at least some of said solar cells on said second substrate being electrically series interconnected;
   (D) said second transparent conductive layer having a thickness such that the light passed through it is optimally at the peak of the spectral response of the semiconductor material in said second panel of solar cells;
   (E) said first and second panels being stacked one on top of the other with said solar cells facing each other in optical series; and
   (F) an interface layer of optically transparent and electrically insulative material sandwiched between said first and second panels.

2. A module as defined in claim 1 wherein said second panel includes single-crystal silicon solar cells.

3. A module as defined in claim 2 wherein each of said panels includes separate electrical connections for providing electrical energy produced thereby externally of said panel.

4. A module as defined in claim 3 wherein said electrical connections further include electrical leads connected to said transparent conductive layers for providing electrical energy produced by said thin film panel externally thereof.

5. A module as defined in claim 4 wherein said second panel of solar cells includes thin film semiconductor solar cells deposited upon an optically transparent substrate with electrical leads connected to said cells for providing electrical energy produced by said second panel externally thereof.

6. A module as defined in claim 5 which further includes a transparent conductive layer on each side of said second panel of solar cells, said transparent conductive layers each being an electrical connection to said cells.

7. A module as defined in claim 5 wherein said thin flim semiconductor panels face each other and are separated by said interface layer and said substrates both constitute part of the housing for said module.

8. A module as defined in claim 7 which further includes a third panel of thin film semiconductor solar cells deposited on an optically transparent substrate and sandwiched between said first and second panels.

9. A module as defined in claim 4 wherein said first panel of thin film solar cells includes first and second contiguous layers of monolithic semiconductor material optically and electrically interconnected by a thin tunneling junction.

10. A module as defined in claim 2 which further includes at least one additional panel of thin film semiconductor solar cells.

11. A module as defined in claim 1 wherein said optically transparent substrate further constitutes a part of the housing for said module.

12. A module as defined in claim 1 wherein said second panel of solar cells includes thin film semiconductor solar cells.

13. A module as defined in claim 12 which further includes at least one additional panel of thin film semiconductor solar cells separated from its adjacent panel by a layer of optically transparent and electrically insulative material and each such additional panel having a different spectral response from each other panel whereby each such panel will be responsive a predetermined different portion of the solar spectrum.

14. A module as defined in claim 13 wherein each such additional panel includes electrical leads connected thereto for providing electrical energy produced thereby externally of said panel.

15. A module as defined in claim 1 wherein said interface layer of material is thermally stable.

16. A module as defined in claim 1 wherein said interface layer is solid and adheres said first and second panels together.

17. A module as defined in claim 16 wherein said interface layer includes as its major constituant a material selected from the group consisting of polyvinyl butyral, silicone, and ethylene vinyl acetate.

18. A module as defined in claim 1 wherein said interface layer is a gas.

19. A module as defined in claim 18 wherein said gas is air.

20. A module as defined in claim 1 wherein said interface layer is a liquid.

21. A photovoltaic module comprising:
   (A) a first independently operable panel of solar cells having a first bandgap and including a first substrate having a plurality of thin film solar cells formed thereon, at least some of said thin film solar cells being electrically series interconnected;

(B) a second independently operable panel of solar cells having a second bandgap, said first and second band gaps being different, said second panel including a second substrate carrying a plurality of solar cells, at least some of said solar cells on said second substrate being electrically series interconnected;

(C) said first and second panels being stacked one on top of the other with said solar cells facing each other in optical series and with said substrates facing outwardly, said substrates forming a housing for said photovoltaic module; and (D) an interface layer of optically transparent and electrically insulative material sandwiched between said first and second panels and adhesively securing said first and second panels together.

22. A module as defined in claim 21 wherein said interface layer includes as its major constituent a material selected from the group consisting of polyvinylbutyral, silicone and ethylene vinyl acetate.

23. A module as defined in claim 22 wherein said second panel of solar cells includes thin film semiconductor solar cells deposited upon an optically transparent substrate with electrical leads connected to said cells for providing electrical energy produced by said second panel externally thereof.

24. A module as defined in claim 23 which further includes a transparent conductive layer on each side of said second panel of solar cells, said transparent conductive layers each being an electrical connection to said cells.

* * * * *